US008421051B2

United States Patent
Sato et al.

(10) Patent No.: US 8,421,051 B2
(45) Date of Patent: Apr. 16, 2013

(54) RESISTANCE-CHANGE MEMORY

(75) Inventors: Mitsuru Sato, Kuwana (JP); Kohichi Kubo, Yokohama (JP); Chikayoshi Kamata, Kawasaki (JP); Noriko Bota, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 316 days.

(21) Appl. No.: 12/844,408

(22) Filed: Jul. 27, 2010

(65) Prior Publication Data

US 2011/0031463 A1    Feb. 10, 2011

(30) Foreign Application Priority Data

Aug. 7, 2009   (JP) .................. 2009-184791

(51) Int. Cl.
*H01L 47/00*    (2006.01)
(52) U.S. Cl.
USPC ............ 257/4; 257/3; 257/43; 257/E45.001
(58) Field of Classification Search .................. 257/2–4, 257/43
See application file for complete search history.

(56) References Cited

U.S. PATENT DOCUMENTS

| | | | |
|---|---|---|---|
| 2009/0102598 A1* | 4/2009 | Yamazaki et al. | 338/20 |
| 2010/0046273 A1* | 2/2010 | Azuma et al. | 365/148 |
| 2010/0202186 A1* | 8/2010 | Sato et al. | 365/148 |
| 2011/0026299 A1* | 2/2011 | Kanno et al. | 365/148 |
| 2011/0037046 A1* | 2/2011 | Sato et al. | 257/4 |
| 2011/0103131 A1* | 5/2011 | Katayama et al. | 365/148 |

FOREIGN PATENT DOCUMENTS

| | | | |
|---|---|---|---|
| WO | WO 2009/001534 | * | 12/2008 |
| WO | WO 2009/034687 A1 | | 3/2009 |
| WO | WO 2010/125780 | * | 11/2010 |

* cited by examiner

*Primary Examiner* — A. Sefer
(74) *Attorney, Agent, or Firm* — Oblon, Spivak, McClelland, Maier & Neustadt, L.L.P.

(57) ABSTRACT

According to one embodiment, a resistance-change memory includes a variable resistance element having a laminated structure in which a first electrode, a resistance-change film and a second electrode are laminated, and set to a low-resistance state and a high-resistance state according to stored data, an insulating film provided on a side surface of the variable resistance element, and a fixed resistance element provided on a side surface of the insulating film, and includes a conductive film, the fixed resistance element being connected in parallel with the variable resistance element.

14 Claims, 12 Drawing Sheets

RESISTANCE-CHANGE MEMORY

CROSS-REFERENCE TO RELATED APPLICATIONS

This application is based upon and claims the benefit of priority from Japanese Patent Application No. 2009-184791, filed Aug. 7, 2009; the entire contents of which are incorporated herein by reference.

FIELD

Embodiments described herein relate generally to a resistance-change memory.

BACKGROUND

Nonvolatile semiconductor memory is widely used for storage in electronic devices such as personal computers (PCs), cellular telephones, digital cameras and personal digital assistants (PDAs). Such memory includes resistive random access memory (ReRAM), magnetic random access memory (MRAM) and phase-change random access memory (PCRAM), all of which utilize a variable resistance element as a memory cell.

In an ReRAM, the resistance of a variable resistance element that varies according to application of a voltage or current is used as memory information. If the variable resistance element is operated to perform a binary operation, for example, the low-resistance state of the variable resistance element is set to correspond to binary 1 and the high-resistance state thereof is set to correspond to binary 0. The operation of changing the state from the high-resistance state to the low-resistance state is referred to as "set" and the reverse operation is referred to as "reset".

For example, if a metal oxide film is used as a resistance-change film, the voltage (set voltage) required for setting the resistance-change film is generally set higher than the voltage (reset voltage) required for resetting the same. Since an interconnection and a selection element are connected to a resistance-change film when a memory cell array is configured by using variable resistance elements, a large portion of voltages that have been applied to the interconnection and selection element is applied to the resistance-change film if the resistance of the resistance-change film is rapidly increased at the reset time. If the voltage applied to the resistance-change film immediately after resetting is higher than the set voltage, the resistance-change film is transited to the low-resistance state again and an erroneous operation occurs.

Generally, the set voltage and reset voltage of the resistance-change film, the resistance of the low-resistance state and the resistance of the high-resistance state have variations in the respective elements or they have variations in one element each time the switching operation is performed. For example, since a voltage applied to the resistance-change film immediately after resetting varies if the resistance of the high-resistance state varies, the possibility that an erroneous operation occurs becomes strong.

A writing method of a resistance-change memory has been disclosed in a reference (for example, PCT National Publication No. WO2009/034687).

DETAILED DESCRIPTION

In general, according to one embodiment, there is provided a resistance-change memory comprising: a variable resistance element having a laminated structure in which a first electrode, a resistance-change film and a second electrode are laminated, and set to a low-resistance state and a high-resistance state according to stored data; an insulating film provided on a side surface of the variable resistance element; and a fixed resistance element provided on a side surface of the insulating film, and comprising a conductive film, the fixed resistance element being connected in parallel with the variable resistance element.

The embodiments will be described hereinafter with reference to the accompanying drawings. In the description which follows, the same or functionally equivalent elements are denoted by the same reference numerals, to thereby simplify the description.

First Embodiment

Figure 1:
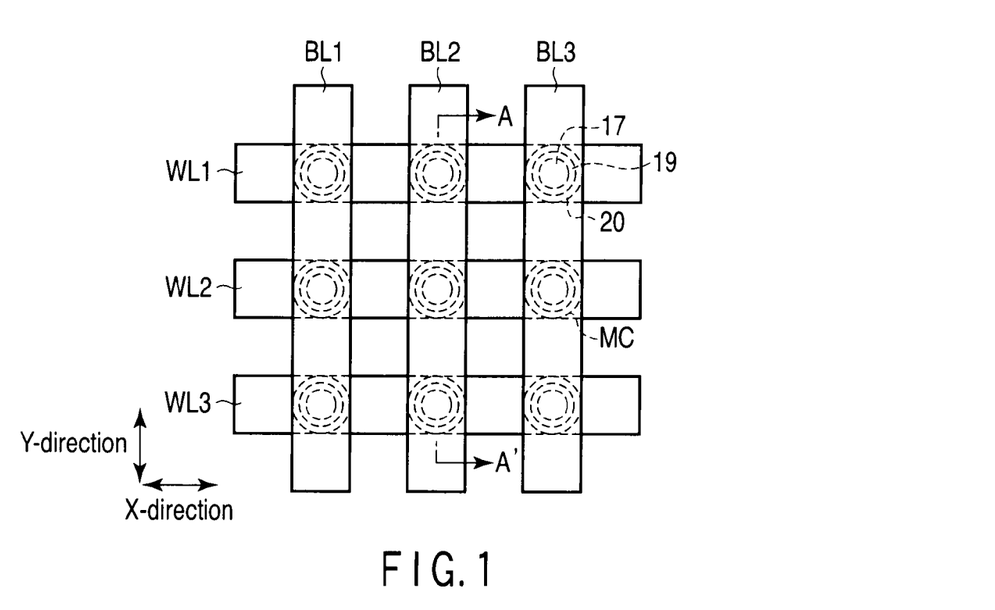
FIG. 1 is a plan view showing the structure of a resistance-change memory according to a first embodiment.
Figure 2:
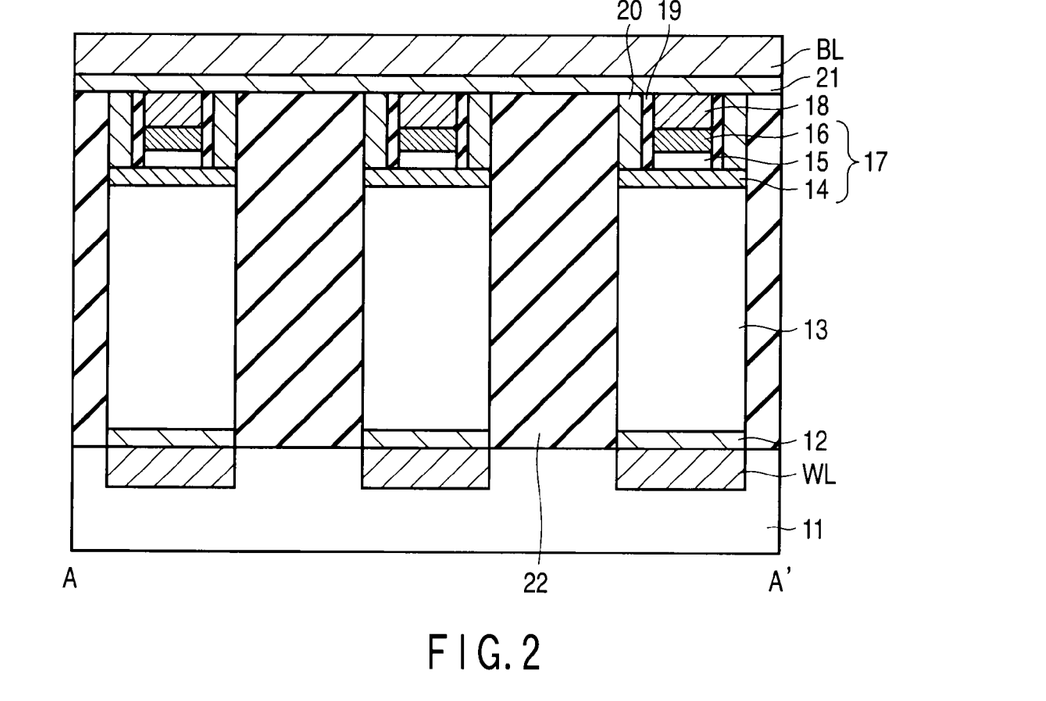
FIG. 2 is a cross-sectional view showing the resistance-change memory taken along line A-A' of FIG. 1.

FIG. 1 is a plan view showing the structure of a resistance-change memory according to a first embodiment. FIG. 2 is a cross-sectional view showing the resistance-change memory taken along line A-A' of FIG. 1. The resistance-change memory of this embodiment is a semiconductor storage device using variable resistance elements as memory cells.

For example, an interlayer insulating layer 11 formed of silicon oxide ($SiO_2$), for example, is formed on a layer of a desired level formed on a single crystal silicon substrate (not shown), for example. In the interlayer insulating layer 11, a plurality of lower interconnection layers are formed to extend in an X direction. The lower interconnection layers correspond to word lines WL. In FIG. 1, only three word lines WL1 to WL3 are shown as an example, but in practice, a larger number of word lines are arranged.

A plurality of upper interconnection layers are formed to extend in a Y direction that intersects with the X direction above the word lines WL. The upper interconnection layers correspond to bit lines BL. In FIG. 1, only three bit lines BL1 to BL3 are shown as an example, but in practice, a larger number of bit lines are arranged.

A plurality of memory cells MC are respectively provided in intersection areas between the plural word lines WL and the plural bit lines BL. That is, the resistance-change memory of this embodiment is of a cross-point type.

The planar shape of the memory cell MC is not particularly limited. In this embodiment, the planar shape of the memory cell MC is a circle, for example. Each memory cell MC is formed on the word line WL in a pillar form and comprises a variable resistance element 17 acting as a storage element, a fixed resistance element 20 connected in parallel with the variable resistance element 17 and a diode 13 connected in series with the parallel resistance component and acting as a selection element.

Specifically, barrier films 12 are formed on the word lines WL to prevent metal of the word lines WL from reacting with silicon (Si) of the diodes 13. As the word line WL, for example, tungsten (W) or aluminum (Al) is used. As the barrier film 12, for example, titanium nitride (TiN) or a laminated film of titanium (Ti) and titanium nitride (TiN) is used. The diodes 13 are formed on the respective barrier films 12. As the diode 13, for example, a PIN diode comprising an N-type semiconductor layer, P-type semiconductor layer and intrinsic semiconductor layer (I layer) sandwiched between the above semiconductor layers is used.

On each diode 13, the variable resistance element 17 is formed. The variable resistance element 17 is configured by sequentially laminating a lower electrode 14, resistance-change film 15 and upper electrode 16. The diameter (or area) of the lower electrode 14 is equal to that of the diode 13. The diameter (or area) of each of the resistance-change film 15 and upper electrode 16 is less than the diameter (or area) of the lower electrode 14.

The resistance-change film 15 can take at least two resistances as a bi-stable state at room temperatures by applying a voltage or supplying a current thereto. The memory operation for at least binary data can be realized by writing or reading the two stable resistances. If an attempt is made to cause the resistance-change film 15 to perform the binary memory operation, for example, the low-resistance state of the resistance-change film 15 is set to correspond to binary 1 and the high-resistance state thereof is set to correspond to binary 0. As the resistance-change film 15, for example, $NiO_x$, $CoO_x$, $TiO_x$, $NbO_x$, $TaO_x$, $CeO_x$, $HfO_x$, $ZrO_x$, $MnO_x$, $CrO_x$, $FeO_x$ or $CuO_x$ is provided. "x" indicating a composition ratio is a natural number equal to or more than 1.

As the lower electrode 14, for example, a laminated film of titanium silicide and titanium nitride (TiN) is used. That is, titanium silicide is formed on the interface between the diode 13 and titanium nitride (TiN) by disposing titanium (Ti) between titanium nitride (TiN) and silicon (Si) and silicifying the titanium (Ti). By providing titanium silicide on the interface between the diode 13 and titanium nitride (TiN), the interface resistance can be decreased. As the upper electrode 16, for example, titanium nitride (TiN) is used.

On the variable resistance element 17, a conductive stopper layer 18 formed to protect the variable resistance element 17 and functioning as a stopper at the time of a chemical mechanical polishing (CMP) process is provided. As the stopper layer 18, for example, tungsten (W) is used.

The fixed resistance element 20 connected in parallel with the variable resistance element 17 is provided around the variable resistance element 17. Specifically, an insulating film 19 is provided on the peripheral portions of the variable resistance element 17 and stopper layer 18 and formed in contact with the circumferential surfaces thereof. A conductive film 20 functioning as the fixed resistance element is provided around the insulating film 19 and formed in contact with the circumferential surface thereof. As the insulating film 19, for example, silicon oxide ($SiO_2$), silicon nitride (SiN) or aluminum oxide ($Al_2O_3$) is used. The film thickness of the insulating film 19 is set to approximately 1 to 10 nm. As the conductive film 20, silicon (Si) doped with boron (B), phosphorus (P) or arsenic (As), titanium (Ti), titanium nitride (TiN), tungsten (W), tungsten nitride (WN), tantalum (Ta) or tantalum nitride (TaN) is provided. The film thickness of the conductive film 20 is set to approximately 1 to 10 nm.

A barrier film 21 is formed on the stopper layers 18, insulating films 19 and conductive films 20. The bit lines BL are formed on the barrier film 21. The barrier film 21 is formed to prevent metal of the bit line BL from reacting with silicon (Si) of the conductive film 20. As the barrier film 21, for example, titanium nitride (TiN) or a laminated film of titanium (Ti) and titanium nitride (TiN) is provided. As the bit line BL, for example, tungsten (W) or aluminum (Al) is used.

An interlayer insulating layer 22 formed of silicon oxide ($SiO_2$) is provided between the memory cells MC. Thus, the resistance-change memory according to the first embodiment is configured.

Figure 3:
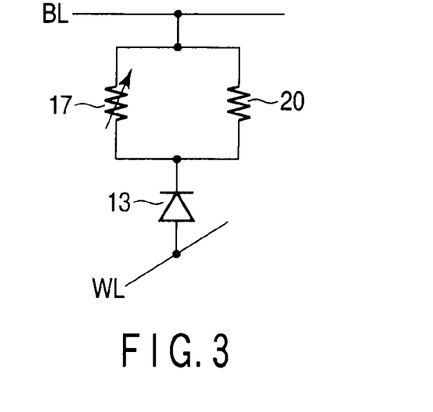
FIG. 3 is a circuit diagram of one memory cell MC.

FIG. 3 is a circuit diagram of one memory cell MC. One end of the variable resistance element 17 is connected to the bit line BL. The other end of the variable resistance element 17 is connected to the cathode of the diode 13. The anode of the diode 13 is connected to the word line WL. The connection relation of the diode 13 is adequately set according to the configuration of the peripheral circuit of the resistance-change memory and the configuration of the resistance-change film 15. The fixed resistance element (conductive film) 20 is connected in parallel with the variable resistance element 17.

As described before, when the variable resistance element 17 is operated to perform the binary operation, for example, the low-resistance state of the variable resistance element 17 is set to correspond to binary 1 and the high-resistance state is set to correspond to binary 0. The operation of changing the state from the high-resistance state to the low-resistance state is referred to as "set" and the reverse operation is referred to as "reset". For example, if a metal oxide film is used as the resistance-change film 15, the voltage (set voltage) required for setting the resistance-change film is generally set higher than the voltage (reset voltage) required for resetting the same.

In this embodiment, the fixed resistance element 20 connected in parallel with the variable resistance element 17 is additionally provided. By additionally providing the fixed resistance element 20, an erroneous operation due to a variation in the resistance in the high-resistance state of the variable resistance element 17 can be suppressed.

Figure 4:
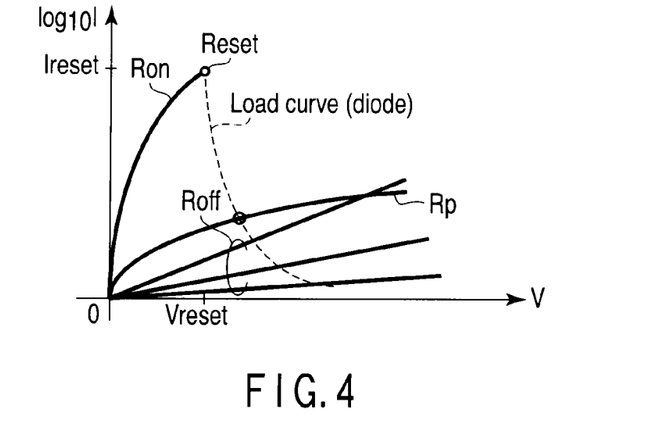
FIG. 4 is a graph showing IV curves of a variable resistance element 17 and fixed resistance element 20.

FIG. 4 is a graph showing current-voltage characteristics (IV curves) of the variable resistance element 17 and fixed resistance element 20. The ordinate of FIG. 4 represents the common logarithm of the current I and the abscissa represents the voltage (V). In FIG. 4, the variable resistance element 17 in the low-resistance state is indicated by a curve Ron. The variable resistance element 17 in the high-resistance state is indicated by a curve Roff. Since the resistance in the high-resistance state has a variation, it is indicated by means of three straight lines as one example. The fixed resistance element 20 is indicated by a curve Rp.

Since resistance Ron of the variable resistance element 17 in the low-resistance state is small, a large current will flow even when a low voltage is applied. When the application voltage to the variable resistance element 17 exceeds reset voltage Vreset, the variable resistance element 17 is reset and the state of the variable resistance element 17 is changed to the high-resistance state.

In this case, resistance Rp of the fixed resistance element 20 is set smaller than resistance Roff of the variable resistance element 17 in the high-resistance state having a variation. Then, as shown in FIG. 4, a voltage applied to the variable resistance element 17 immediately after resetting becomes a voltage that is determined by an interconnection between the curve Rp of the fixed resistance element 20 and the load curve of the diode 13 irrespective of the resistance variation of the variable resistance element 17 in the high-resistance state. That is, since a voltage applied to the variable resistance element 17 is determined by the fixed resistance element 20, an erroneous operation due to the resistance variation of the variable resistance element 17 can be suppressed.

If resistance Rp of the fixed resistance element 20 is excessively small, the difference in resistance between the low-resistance state and the high-resistance state of the variable resistance element 17 becomes small, and there occurs a problem that a read margin is reduced or the power consumption at the set operation time increases. Therefore, it is desirable to set resistance Rp of the fixed resistance element 20 to the maximum value in a range in which the resistance variation of the variable resistance element 17 in the high-resistance state is contained. Specifically, it is desirable to set resistance Rp of the fixed resistance element 20 in a range of 10 kΩ to 50 MΩ.

Limit current Icomp is defined by the peripheral circuit so as not to pass a large current that dielectrically breaks down the resistance-change film 15 into the variable resistance element 17 at the set time, and set current Iset that exceeds limit current Icomp is prevented from flowing into the resistance-change film 15. Limit current Icomp at the set time is smaller than a current that dielectrically breaks down the resistance-change film 15 and is larger than a current that sets the resistance-change film 15. If limit current Icomp is used, the upper limit of resistance Rp of the fixed resistance element 20 satisfies the following expression.

$Rp = Vset/Ip < Vset/Icomp$

Vset indicates a set voltage of the variable resistance element 17 and Ip indicates a current flowing in the fixed resistance element 20 at the application time of set voltage Vset.

Further, resistance Rp of the fixed resistance element 20 is set larger than resistance Ron of the low-resistance state of the variable resistance element 17. That is, the lower limit of resistance Rp of the fixed resistance element 20 satisfies the following expression.

$Rp > Ron$

Figure 5:
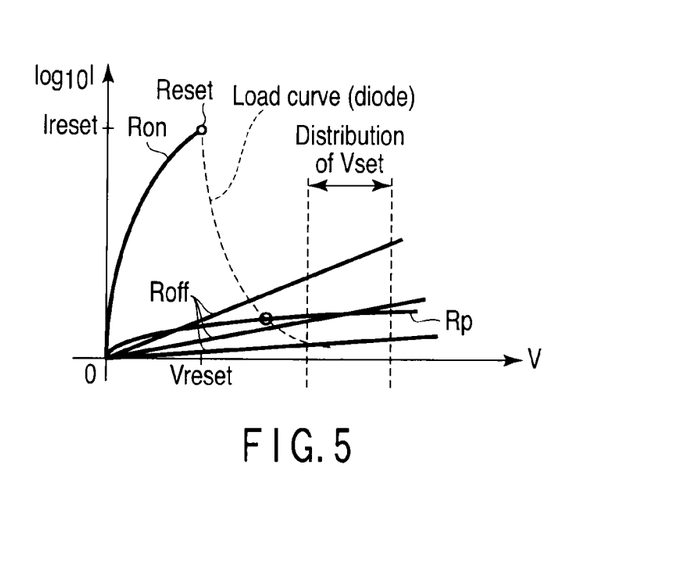
FIG. 5 is a graph for illustrating the distribution of set voltage Vset.

The main cause of the erroneous operation occurs when the variable resistance element 17 is changed to particularly large resistance in the high-resistance state. As shown in FIG. 5, if a voltage at the interconnection between the curve Rp of the fixed resistance element 20 and the load curve of the diode 13 becomes a voltage lower than the distribution of set voltage Vset, an erroneous operation can be suppressed. Resistance Rp of the fixed resistance element 20 does not cause any problem if it is a resistance that satisfies the above condition even if it lies within the distribution range of resistance Roff in the high-resistance state.

(Manufacturing Method)

Next, one example of the manufacturing method of the resistance-change memory according to the first embodiment is explained with reference to the drawings. The drawings of the manufacturing steps used in the following explanation are drawings taken along lines A-A' of FIG. 1.

Figure 6:
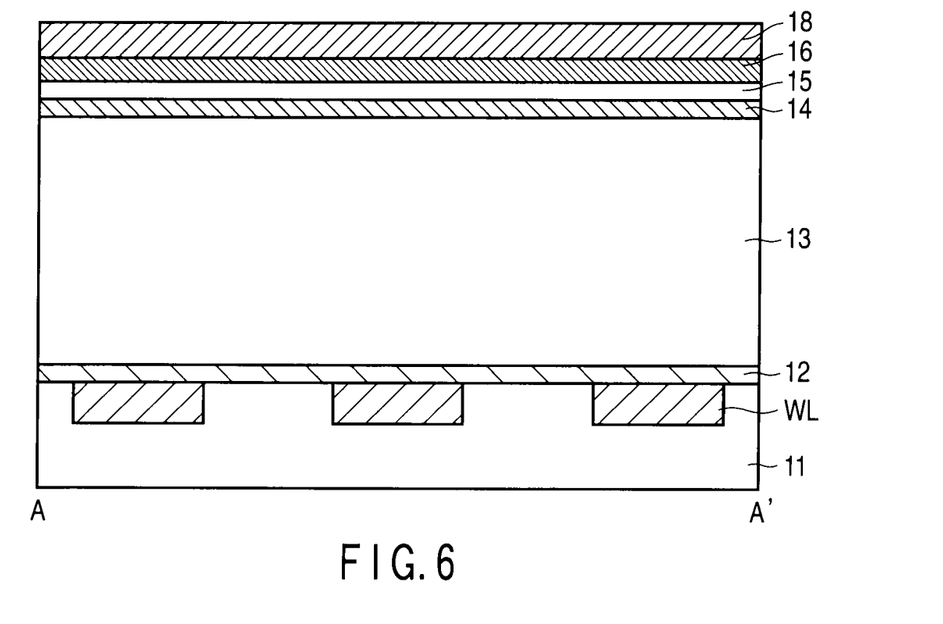
FIG. 6 is a cross-sectional view showing a manufacturing step of the resistance-change memory according to the first embodiment.

As shown in FIG. 6, for example, an interlayer insulating layer 11 formed of silicon oxide (SiO$_2$), for example, is deposited on a layer of a desired level formed on a single crystal silicon substrate (not shown), for example. Then, a plurality of lower interconnection layers (word lines WL) are formed in the interlayer insulating layer 11 by means of a damascene method, for example. That is, a plurality of grooves having the same shape as the word lines WL are formed in the interlayer insulating layer 11. Subsequently, an interconnection material is deposited in the grooves and then the upper surface of the interlayer insulating layer 11 is made flat to leave the interconnection material only in the groove portions. As a result, a plurality of linear word lines WL that extend in an X direction are formed in the interlayer insulating layer 11.

Next, a barrier film 12, a material (P-type semiconductor layer, intrinsic semiconductor layer, N-type semiconductor layer) of PIN diodes 13, lower electrode 14, resistance-change film 15, upper electrode 16 and stopper layer 18 are sequentially deposited on the word lines WL and inter-level insulating layer 11. In order to form the diode 13, a P-type semiconductor layer, intrinsic semiconductor layer containing no impurity (or the impurity concentration thereof is sufficiently low) and N-type semiconductor layer are formed by selectively supplying source gas containing phosphorus (P) or boron (B) while a silicon layer is being formed. Alternatively, after formation of a silicon layer, PIN diodes 13 may be formed by ion-implantation.

Figure 7:
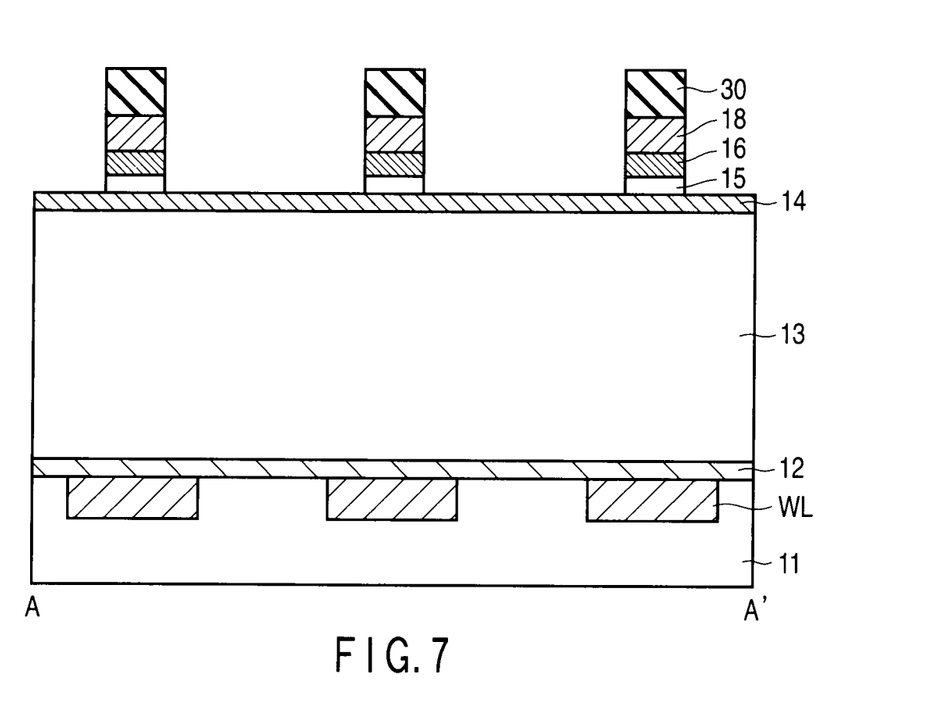
FIG. 7 is a cross-sectional view showing a manufacturing step of the resistance-change memory after the step of FIG. 6.

Then, as shown in FIG. 7, hard mask layers 30 of a number corresponding to the number of variable resistance elements 17 are formed in forming areas of the variable resistance elements 17 on the stopper layer 18 by means of a lithography process and reactive ion etching (RIE) process. The planar shape of each of the hard mask layers 30 is set to the same as the planar shape of the variable resistance element 17. For example, as the hard mask layer 30, silicon oxide, silicon oxynitride or silicon nitride is provided. Subsequently, for example, a laminated film of the stopper layer 18, upper electrode 16 and resistance-change film 15 is processed into a pillar form with the hard mask layer 30 used as a mask by means of the RIE method.

Figure 8:
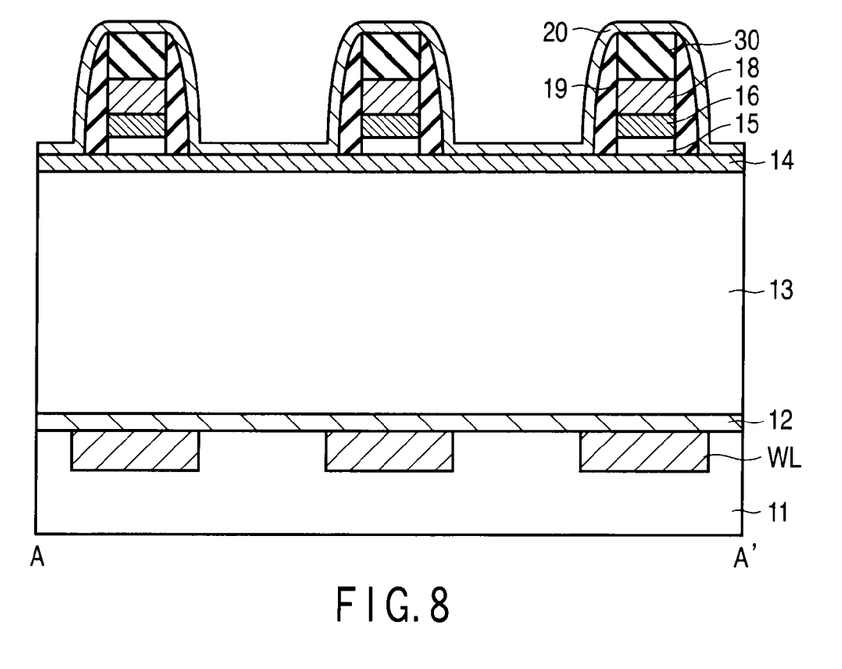
FIG. 8 is a cross-sectional view showing a manufacturing step of the resistance-change memory after the step of FIG. 7.

Next, as shown in FIG. 8, for example, an insulating material 19 is deposited on the entire surface of the device by means of an atomic layer deposition (ALD) method and then a portion of the insulating material that lies on the lower electrode 14 and pillars is eliminated by means of the RIE method. As a result, the circumferential walls (insulating films) 19 that are formed around and in contact with the pillars are formed on the lower electrode 14. Then, for example, a silicon film (conductive film) 20 having boron (B) doped therein is deposited on the entire surface of the device by means of a low-pressure chemical vapor deposition (LPCVD) method.

Figure 9:
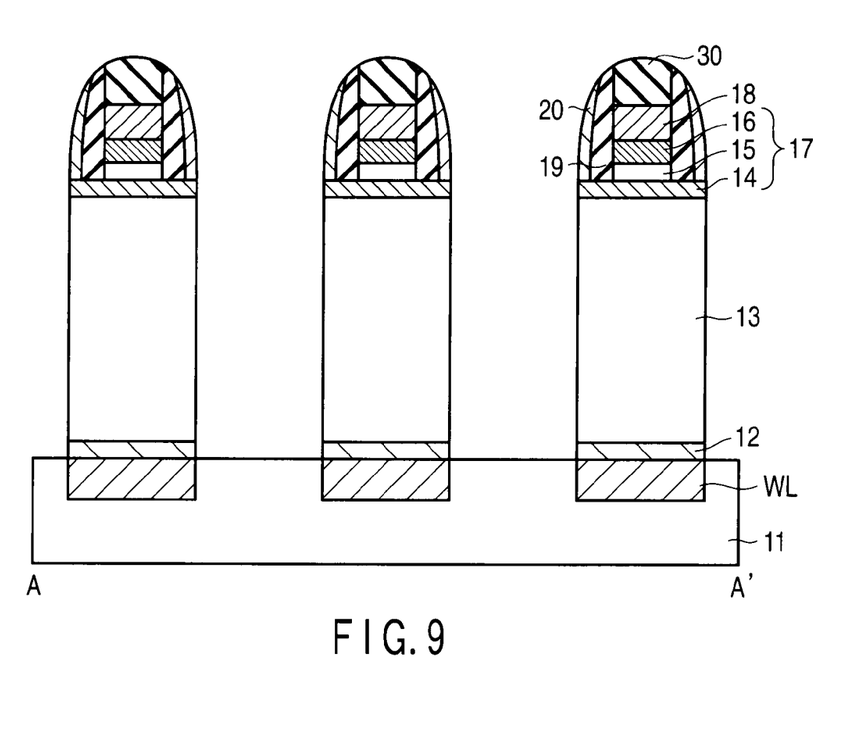
FIG. 9 is a cross-sectional view showing a manufacturing step of the resistance-change memory after the step of FIG. 8.

After this, as shown in FIG. 9, for example, the lower electrode 14 and diode 13 are processed to have the same planar shape as the periphery of the conductive film 20 by means of the RIE method. As a result, memory cells MC each that is configured by the variable resistance element 17, fixed resistance element 20 and diode 13, and has a pillar form are formed on the word lines WL.

Figure 10:
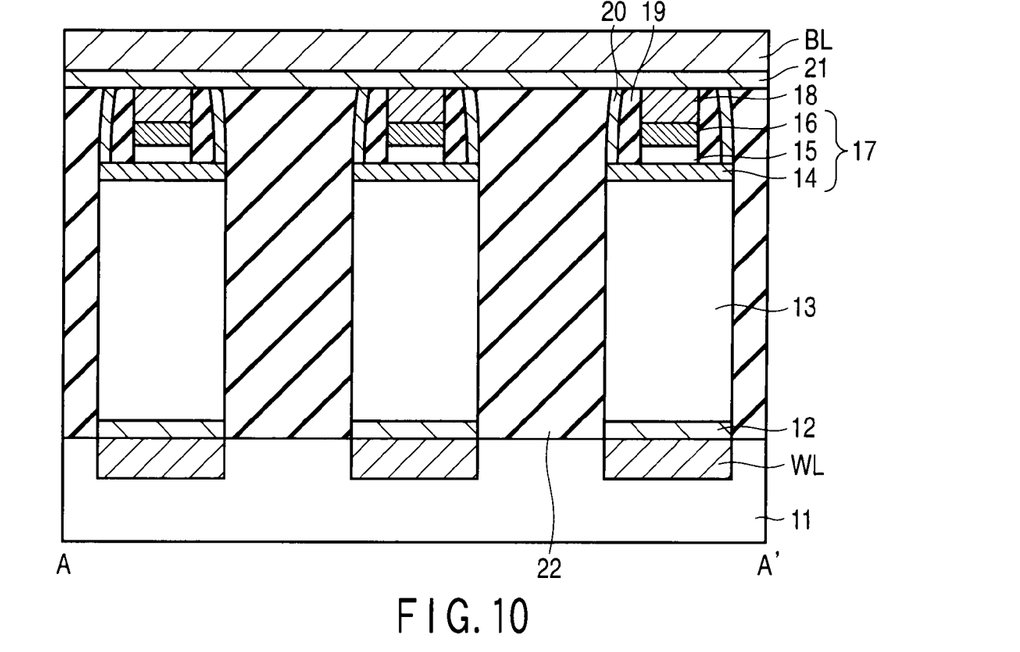
FIG. 10 is a cross-sectional view showing a manufacturing step of the resistance-change memory after the step of FIG. 9.

Next, as shown in FIG. 10, an interlayer insulating layer 22 is filled in each space between the memory cells MC. Then, the hard mask layers 30 are removed with the stopper layers 18 used as CMP stoppers by means of a chemical mechanical polishing (CMP) method to expose the upper surfaces of the stopper layers 18. As a result, the upper surfaces of the memory cells MC and interlayer insulating layers 22 are made flat.

Next, materials of a barrier film 21 and upper interconnection layer (bit line BL) are deposited on the memory cells MC and interlayer insulating layers 22. Then, the barrier film 21 and bit line BL are processed into a plural-line form by means of the lithography method and RIE method. Thus, the resistance-change memory according to the first embodiment is manufactured.

(Effect)

As described above in detail, in the first embodiment, the variable resistance elements 17 are provided on the selection elements (for example, diodes) 13 contained in the memory cells MC in the cross-point resistance-change memory in which the memory cells MC are arranged in the intersection areas between the word lines WL and the bit lines BL. Further, the conductive films 20 used as the fixed resistance-change elements are formed on the insulating films 19 formed on the peripheries of the variable resistance elements 17. Thus, the fixed resistance-change elements 20 that are connected in parallel with the variable resistance elements 17 connected between the selection elements 13 and the bit lines BL are additionally provided. Further, resistance Rp of the fixed resistance element 20 is set smaller than resistance Roff of the variable resistance element 17 in the high-resistance state having a variation.

Therefore, according to the first embodiment, the following effect can be attained. Resistance Roff of the variable resistance elements 17 in the high-resistance state has a variation. In the variation, a variation between the plural variable resistance elements and a resistance variation occurring in the high-resistance state when one variable resistance element is repeatedly set and reset are contained. Since the variable resistance element 17 is set into the high-resistance state immediately after resetting, a high voltage is applied to the variable resistance element 17. However, the voltage applied to the variable resistance element 17 is defined by the fixed resistance element 20 connected in parallel with the variable resistance element 17.

Therefore, a constant voltage lower than a set voltage is applied to the variable resistance element 17 irrespective of the resistance variation of the variable resistance element 17 in the high-resistance state. As a result, since the variable resistance element 17 can be suppressed from being set immediately after resetting, that is, from being set into the low-resistance state again, an erroneous operation of the memory cell MC can be suppressed.

In the first embodiment, the structure in which the conductive film 20 is formed to surround the variable resistance element 17 is shown, but the conductive film 20 and insulating film 19 may be formed on a part of the circumferential surface of the variable resistance element 17 such that the conductive film 20 electrically connects the lower electrode 14 and the upper interconnection layer.

Second Embodiment

The resistance is extremely high at the stage in which variable resistance elements are formed. Therefore, first, the variable resistance element is set into a low-resistance state by performing a process called "forming". That is, a current path (filament) is formed in an insulating film by applying a high voltage to the variable resistance element and a state in which a current is passed through the variable resistance element is set. For example, when a resistance-change film 15 having high crystallinity such as column-shaped crystal is used, a filament formed at the forming stage has directivity. Therefore, the filament is formed in a vertical direction between the lower electrode 14 and the upper electrode 16. In this case, the sidewall insulating films 19 shown in the first embodiment are omitted and the conductive films 20 may be formed directly on the side surfaces of the variable resistance elements 17. However, since the conductive film 20 is formed in contact with a metal film, it is desirable to use titanium nitride (TiN) that does not react with the metal as the conductive film 20.

Figure 11:
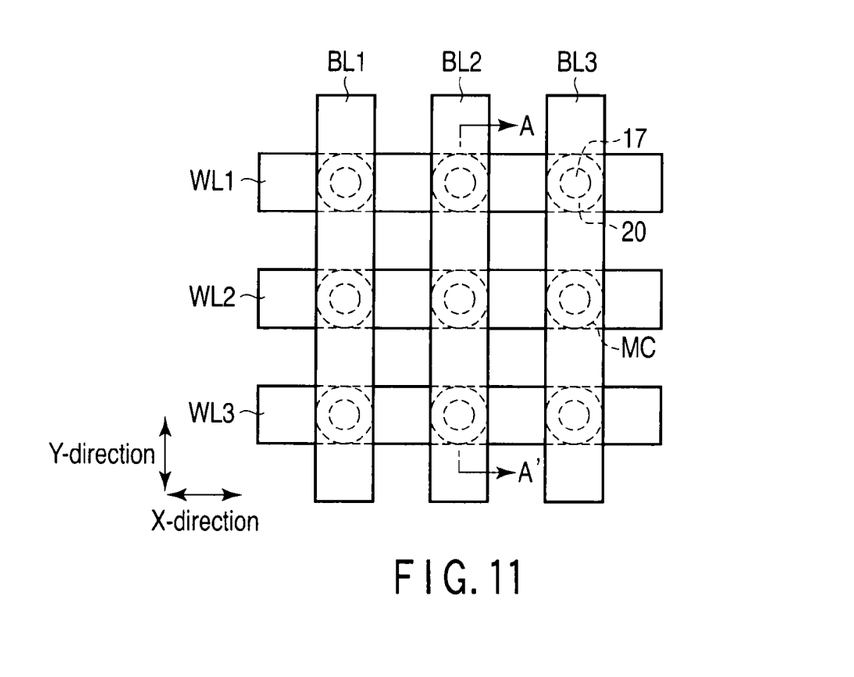
FIG. 11 is a plan view showing the structure of a resistance-change memory according to a second embodiment.
Figure 12:
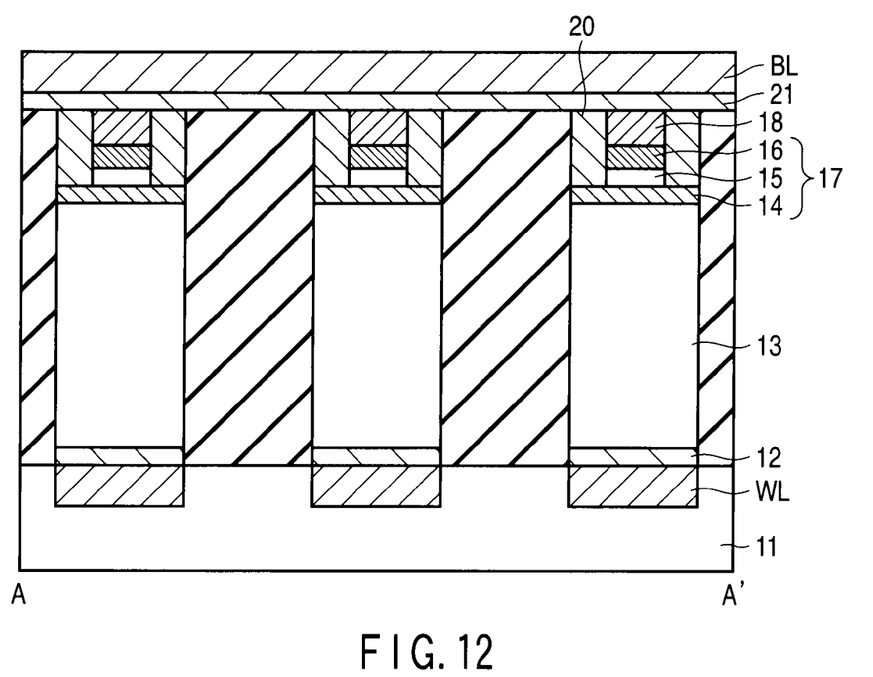
FIG. 12 is a cross-sectional view showing the resistance-change memory taken along line A-A' of FIG. 11.

FIG. 11 is a plan view showing the structure of a resistance-change memory according to the second embodiment. FIG. 12 is a cross-sectional view showing the resistance-change memory taken along line A-A' of FIG. 11. The circuit diagram of the resistance-change memory according to the second embodiment is the same as that of FIG. 3.

Conductive films 20 are formed in contact with the circumferential surfaces and on the peripheral portions of variable resistance elements 17 and stopper layers 18. Further, the conductive films 20 are formed in contact with the lower electrodes 14 and barrier film 21.

As a resistance-change film 15, for example, $NiO_x$, $CoO_x$, $TiO_x$, $NbO_x$, $TaO_x$, $CeO_x$, $HfO_x$, $ZrO_x$, $MnO_x$, $CrO_x$, $FeO_x$, $CuO_x$ or $AlO_x$ is provided. Further, as the conductive film 20, for example, titanium (Ti), titanium nitride (TiN), tungsten (W), tungsten nitride (WN), tantalum (Ta) or tantalum nitride (TaN) is provided. The film thickness of the conductive film 20 is set to approximately 1 to 15 nm.

A barrier film 21 is formed on the stopper layers 18 and conductive films 20. Bit lines BL are formed on the barrier film 21. Thus, the resistance-change memory according to the second embodiment is configured.

The resistance-change memory according to the second embodiment can be formed by using the manufacturing method explained in the first embodiment. That is, the memory can be formed by omitting the manufacturing step of the insulating films 19 formed on the circumferential surfaces of the variable resistance elements 17 and forming the conductive films 20 directly on the circumferential surfaces of the variable resistance elements 17.

As described above in detail, according to the second embodiment, the same effect as that of the first embodiment can be attained. Further, since the insulating films 19 formed in the first embodiment are omitted, the cost can be reduced accordingly.

In the second embodiment, the structure in which the conductive film 20 is formed to surround the variable resistance element 17 is shown, but the conductive film 20 may be formed on a part of the circumferential surface of the variable resistance element 17 so as to electrically connect the lower electrode 14 and the upper interconnection layer.

Third Embodiment

In the third embodiment, a resistance-change memory is formed by means of a manufacturing method different from that of the first embodiment. In this case, the structure of the resistance-change memory is partly different from that of the first embodiment because the manufacturing methods are different.

Figure 13:
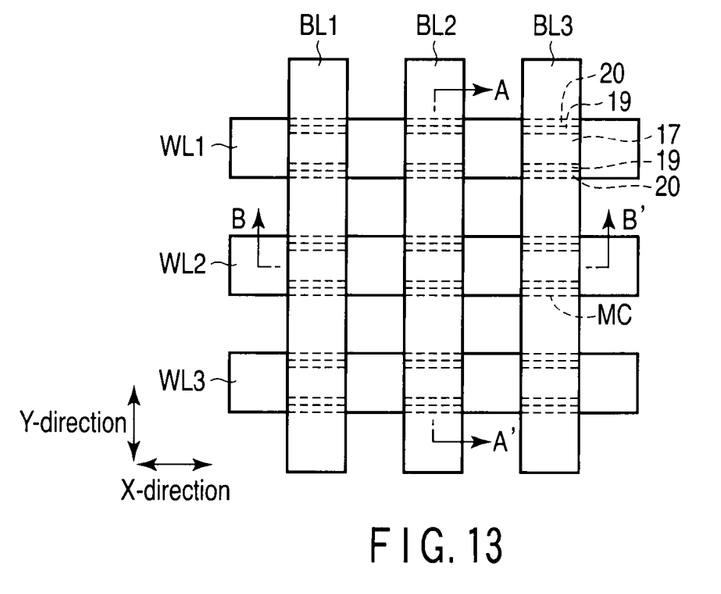
FIG. 13 is a plan view showing the structure of a resistance-change memory according to a third embodiment.
Figure 14:
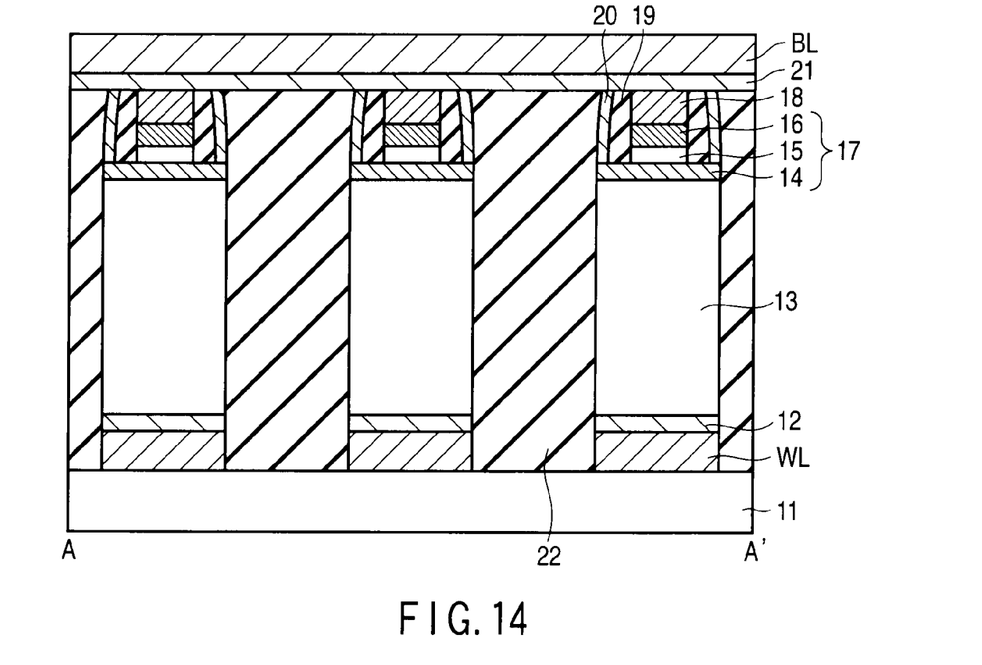
FIG. 14 is a cross-sectional view showing the resistance-change memory taken along line A-A' of FIG. 13.
Figure 15:
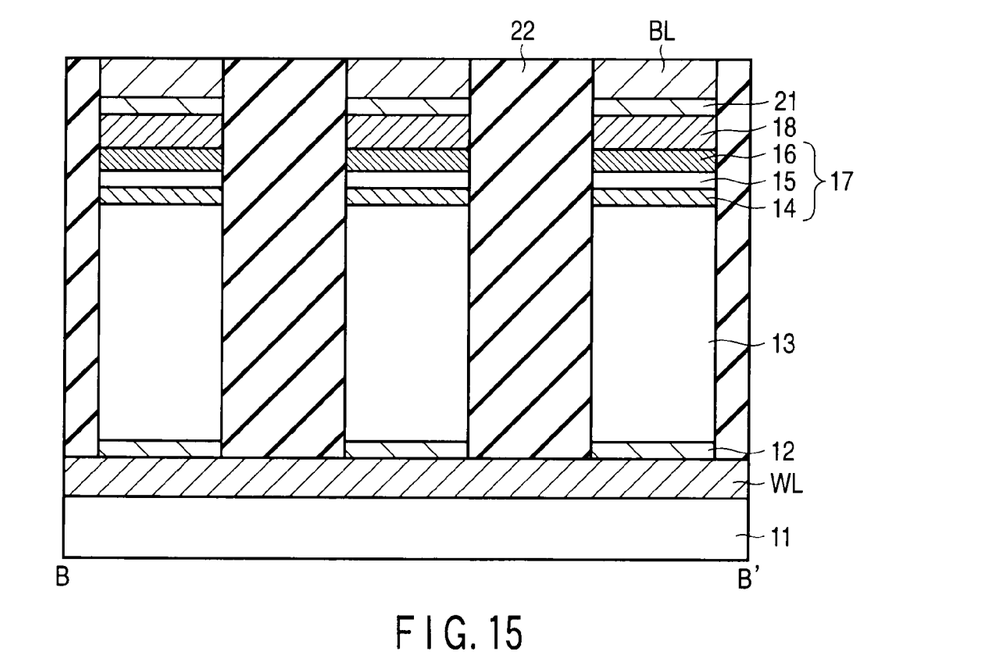
FIG. 15 is a cross-sectional view showing the resistance-change memory taken along line B-B' of FIG. 13.

FIG. 13 is a plan view showing the structure of the resistance-change memory according to the third embodiment. FIG. 14 is a cross-sectional view showing the resistance-change memory taken along line A-A' of FIG. 13. FIG. 15 is a cross-sectional view showing the resistance-change memory taken along line B-B' of FIG. 13. The circuit diagram of the resistance-change memory according to the third embodiment is the same as that of FIG. 3.

Like the first embodiment, memory cells MC in the third embodiment each comprise a variable resistance element 17 and fixed resistance element 20 that are connected in parallel with each other and a selection element (for example, diode) 13 connected in series with the parallel resistance component. The planar shape of the memory cell MC is made as a square because of the manufacturing method as will be described later.

Insulating films 19 are formed in contact with both side surfaces of the variable resistance elements 17 and stopper layers 18 in the Y direction. Conductive films 20 functioning as the fixed resistance elements are formed in contact with both side surfaces of the insulating films 19. The other configuration is the same as that of the first embodiment.

(Manufacturing Method)

Next, one example of the manufacturing method of the resistance-change memory according to the third embodiment is explained with reference to the drawings.

Figure 16:
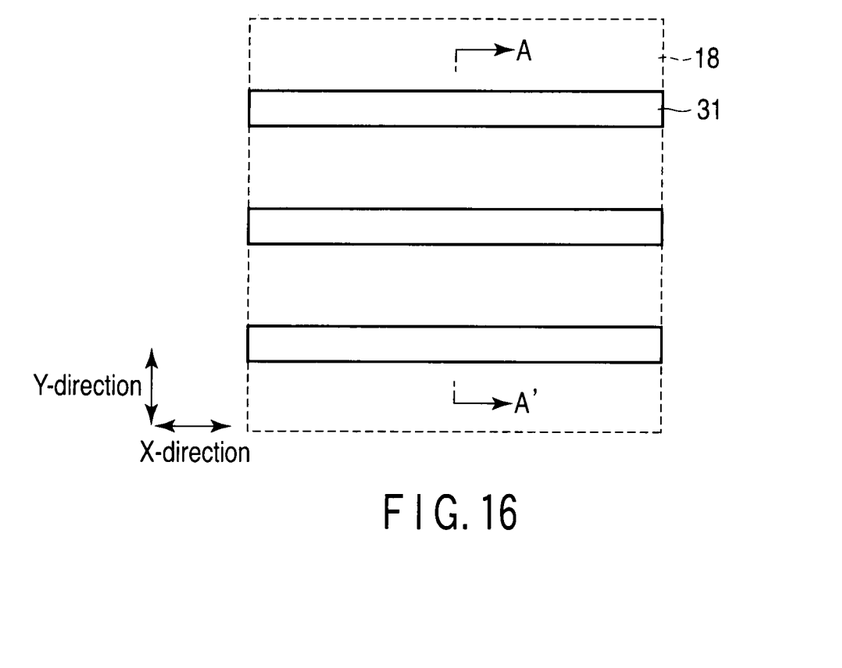
FIG. 16 is a plan view showing a manufacturing step of the resistance-change memory according to the third embodiment.
Figure 17:
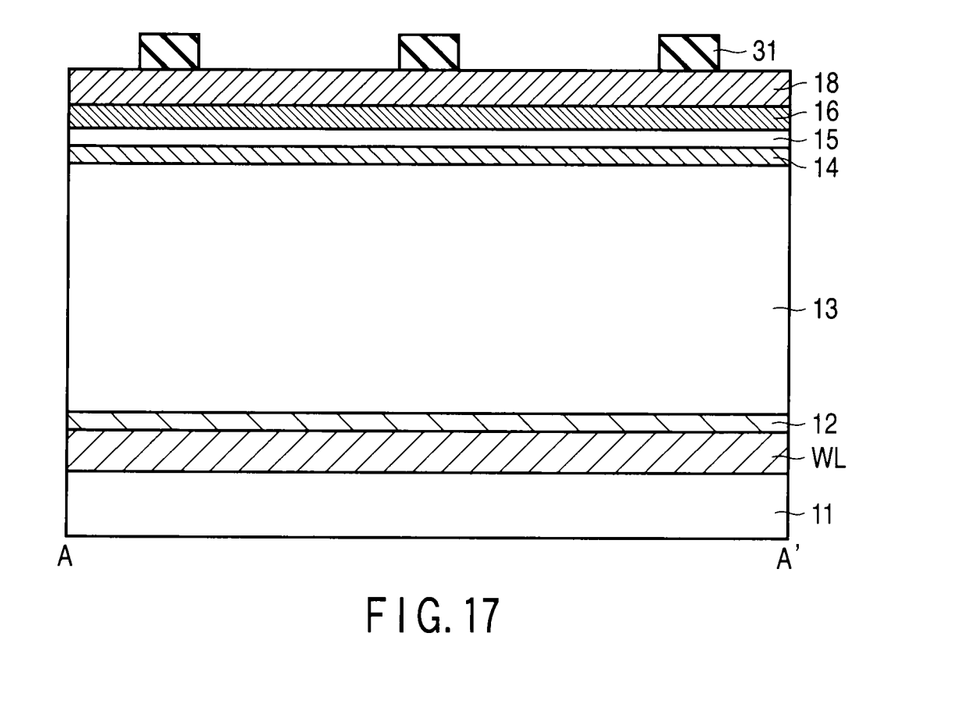
FIG. 17 is a cross-sectional view showing the resistance-change memory taken along line A-A' of FIG. 16.

As shown in FIG. 16 (plan view) and FIG. 17 (cross-sectional view), a word line WL, barrier film 12, a material (P-type semiconductor layer, intrinsic semiconductor layer, N-type semiconductor layer) of PIN diodes 13, lower electrode 14, resistance-change film 15, upper electrode 16 and stopper layer 18 are sequentially deposited on an interlayer insulating layer 11. Then, linear hard mask layers 31 each having the same width as that of the variable resistance element 17 in the Y direction and extending in the X direction are formed on the stopper layer 18. As the hard mask layer 31, for example, silicon oxide, silicon oxynitride or silicon nitride is used.

Figure 18:
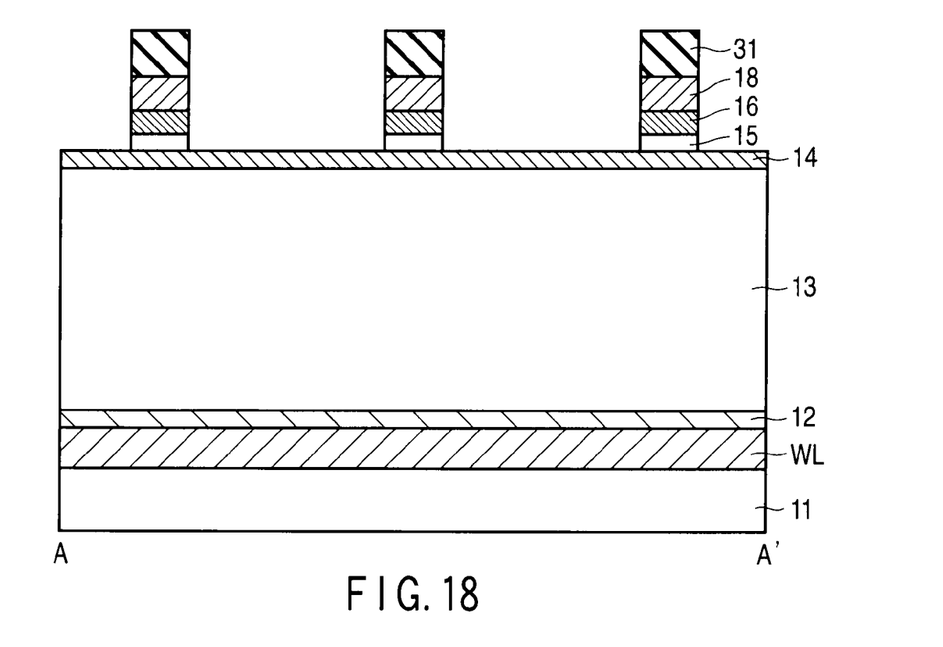
FIG. 18 is a cross-sectional view showing a manufacturing step of the resistance-change memory after the step of FIG. 17.

Subsequently, as shown in FIG. 18, a laminated film of the stopper layer 18, upper electrode 16 and resistance-change film 15 is processed into a line form with the hard mask layer 31 used as a mask by means of the RIE method, for example.

Figure 19:
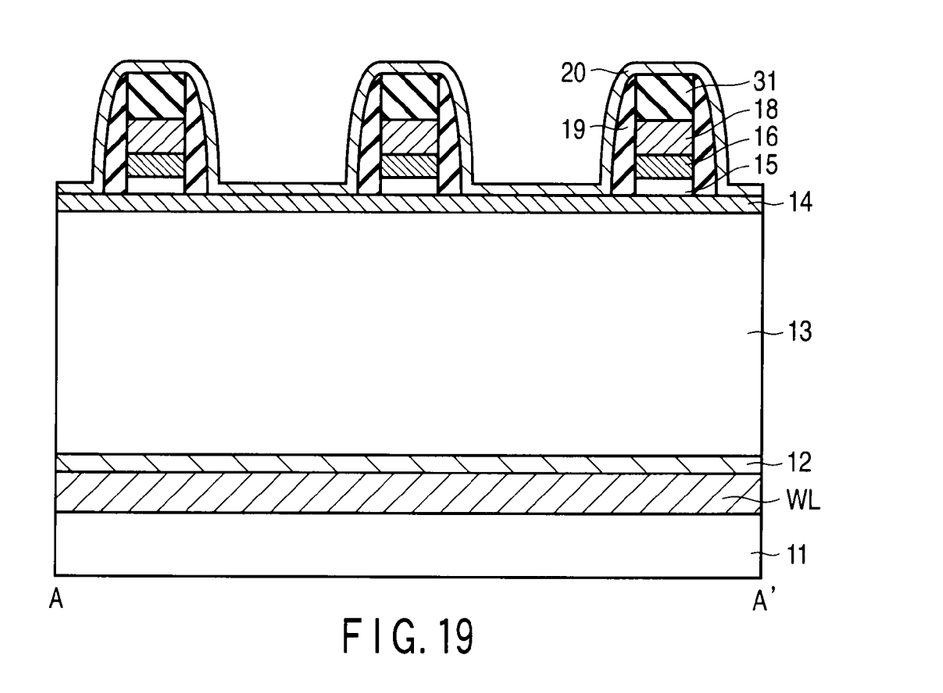
FIG. 19 is a cross-sectional view showing a manufacturing step of the resistance-change memory after the step of FIG. 18.

Next, as shown in FIG. 19, an insulating material 19 is deposited on the entire surface of the device by means of the ALD method, for example, and then the insulating material on the lower electrode 14 and hard mask layer 31 is removed by means of the RIE method. As a result, the sidewalls (insulating films) 19 are formed on the lower electrode 14 and on both side surfaces of the line-form laminated films. After this, a silicon film (conductive film) 20 having boron (B) doped therein is deposited on the entire surface of the device by means of the LPCVD method, for example.

Figure 20:
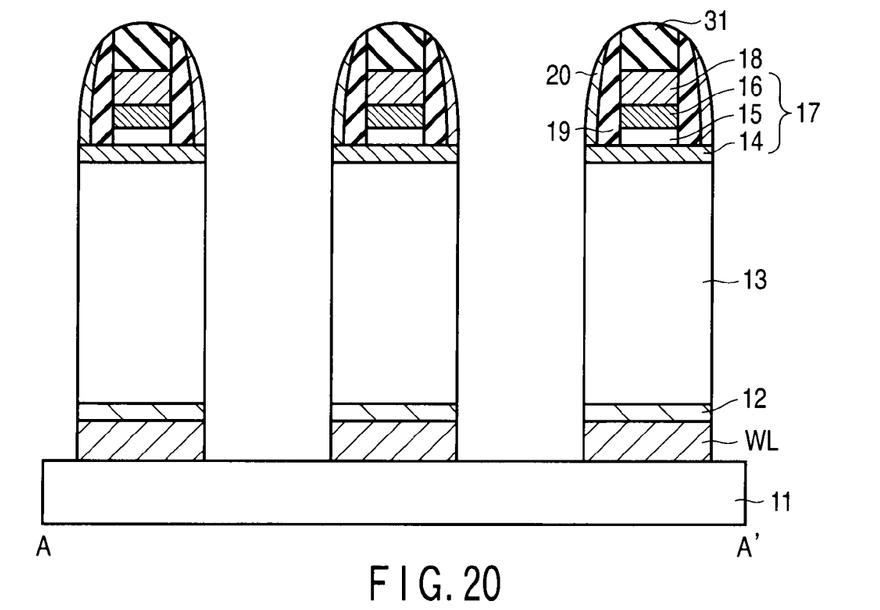
FIG. 20 is a cross-sectional view showing a manufacturing step of the resistance-change memory after the step of FIG. 19.

Next, as shown in FIG. 20, the lower electrode 14, diode 13, barrier film 12 and word line WL are processed to have the same planar shape as that of the peripheral portion of the conductive film 20 by means of the RIE method, for example. Thus, the operation of processing the word lines WL extending in the X direction is completed.

Figure 21:
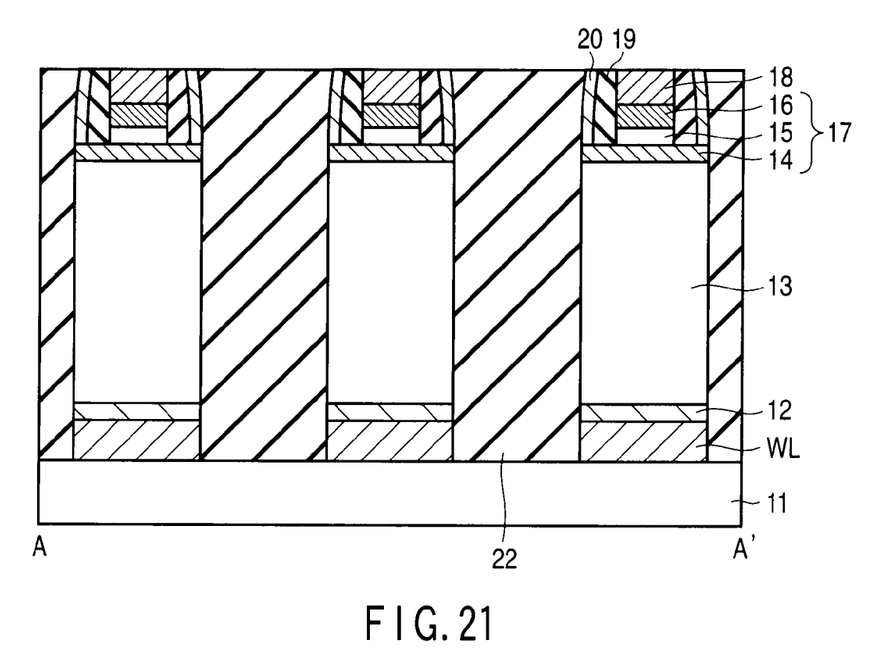
FIG. 21 is a cross-sectional view showing a manufacturing step of the resistance-change memory after the step of FIG. 20.

Subsequently, as shown in FIG. 21, an interlayer insulating layer 22 is filled in each space between the line-form laminated films on the interlayer insulating layer 11. Then, the hard mask layers 30 are removed with the stopper layers 18 used as CMP stoppers by means of the CMP method to expose the upper surfaces of the stopper layers 18. As a result, the upper surfaces of the laminated films and interlayer insulating layers 22 are made flat.

Figure 22:
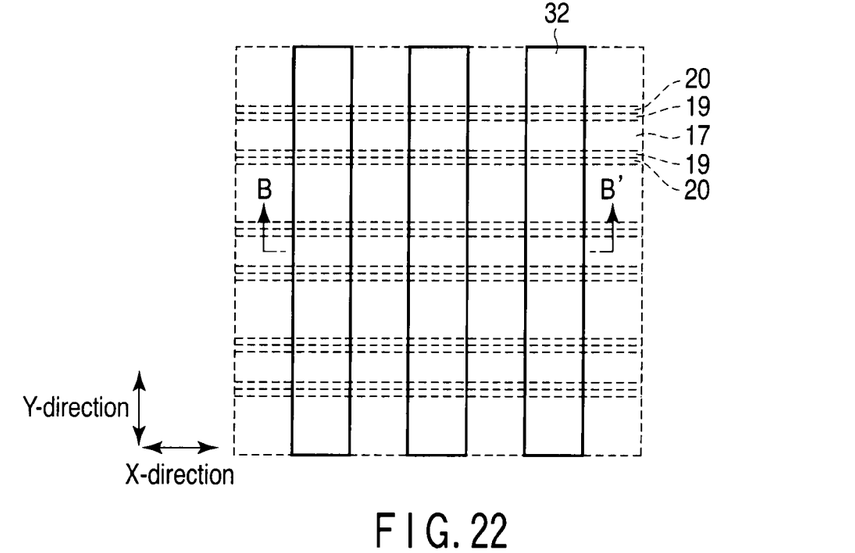
FIG. 22 is a plan view showing a manufacturing step of the resistance-change memory after the step of FIG. 21.
Figure 23:
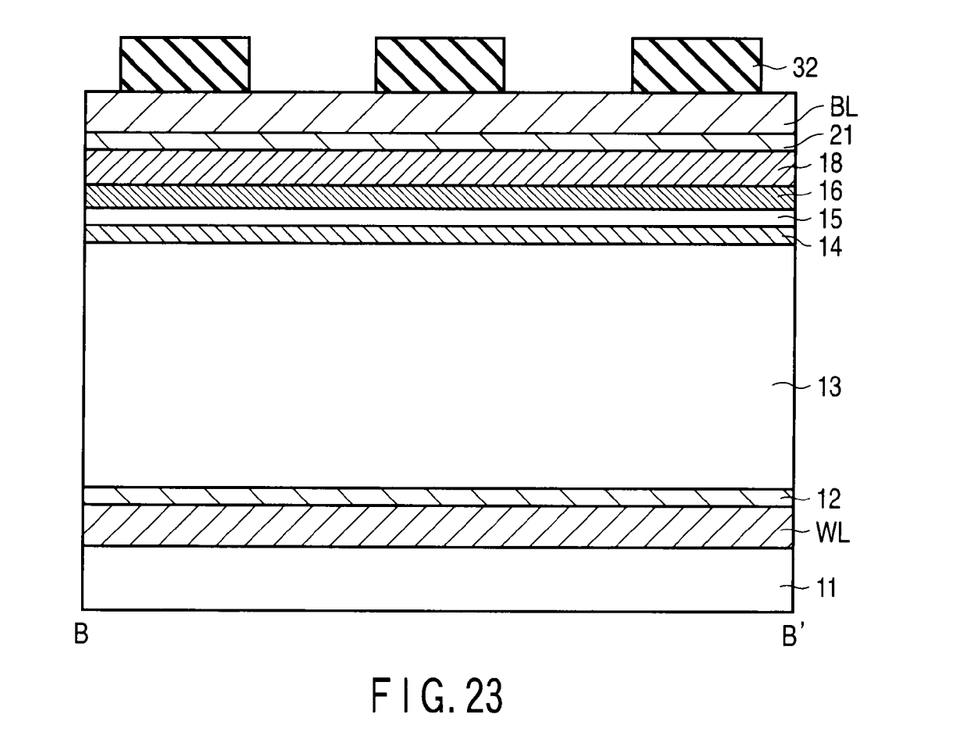
FIG. 23 is a cross-sectional view showing the resistance-change memory taken along line B-B' of FIG. 22.

Next, materials of a barrier film 21 and upper interconnection layer (bit line BL) are deposited on the entire surface of the device as shown in FIG. 22 (plan view) and FIG. 23 (cross-sectional view). Then, hard mask layers 32 each having the same planar shape as that of the bit line BL are formed on the material of the bit lines BL.

Figure 24:
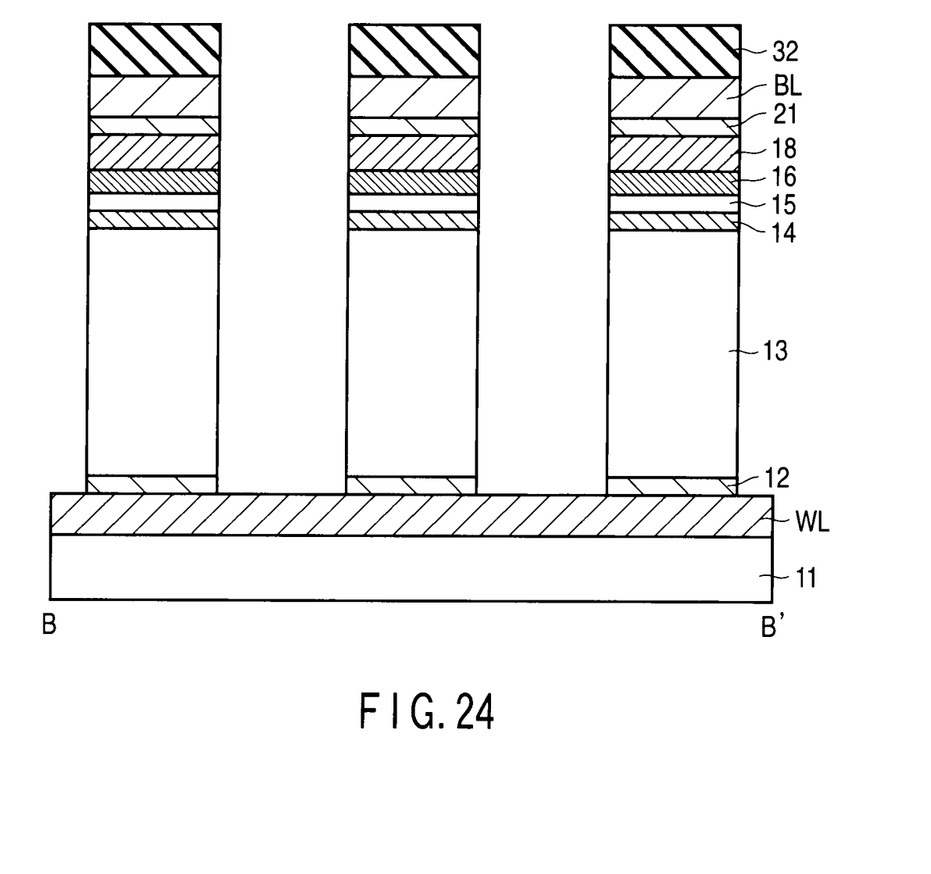
FIG. 24 is a cross-sectional view showing a manufacturing step of the resistance-change memory after the step of FIG. 23.

Subsequently, as shown in FIG. 24, the laminated film is processed to the barrier film 12 with the hard masks 32 used as a mask. As a result, square memory cells MC and bit lines BL extending in the Y direction are formed.

Then, as shown in FIG. 14 and FIG. 15, an interlayer insulating layer 22 is filled in each space between the memory cells MC and between the bit lines BL. Next, the upper surfaces of the interlayer insulating layers 22 and bit lines BL are made flat by means of the CMP method. Thus, the resistance-change memory according to the third embodiment is manufactured.

As described above in detail, also, in the third embodiment, the memory cells MC each comprising the variable resistance element 17 and fixed resistance-change element 20 that are connected in parallel with each other and the selection element (for example, diode) 13 connected in series with the parallel resistance component can be formed. Therefore, according to the third embodiment, the resistance-change memory having the same effect as that of the first embodiment can be attained.

The resistance-change memory according to the second embodiment may be formed by means of the manufacturing method explained in the third embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A resistance-change memory comprising:
a variable resistance element having a laminated structure in which a first electrode, a resistance-change film and a second electrode are laminated, and set to a low-resistance state and a high-resistance state according to stored data;

an insulating film provided on a side surface of the variable resistance element; and a fixed resistance element provided on a side surface of the insulating film, and comprising a conductive film, the fixed resistance element being connected in parallel with the variable resistance element, wherein resistance of the fixed resistance element is smaller than resistance of the variable resistance element in the high-resistance state and larger than resistance of the variable resistance element in the low-resistance state.

2. The memory of claim 1, wherein resistance Rp of the fixed resistance element satisfies a relation of Rp<Vset/Icomp if Vset is a set voltage that changes the state of the variable resistance element from the high-resistance state to the low-resistance state, and Icomp is an upper limit of a current that is supplied with the variable resistance element when the state of the variable resistance element changes from the high-resistance state to the low-resistance state.

3. The memory of claim 2, wherein the upper limit Icomp is smaller than a current that dielectrically breaks down the resistance-change film and larger than a set current that changes the state of the variable resistance element from the high-resistance state to the low-resistance state.

4. The memory of claim 1, further comprising:
a first line connected to a first terminal of the variable resistance element;
a selection element comprising a first terminal connected to a second terminal of the variable resistance element; and
a second line connected to a second terminal of the selection element.

5. The memory of claim 4, wherein the selection element is a diode.

6. The memory of claim 4, wherein memory cells each comprise the variable resistance element, the fixed resistance element and selection element, and the memory cells are arranged in intersection areas between first lines and second lines.

7. The memory of claim 1, wherein
the insulating film is formed to cover the periphery of the variable resistance element, and
the conductive film is formed to cover the periphery of the insulating film.

8. A resistance-change memory comprising:
a variable resistance element having a laminated structure in which a first electrode, a resistance-change film and a second electrode are laminated, and set to a low-resistance state and a high-resistance state according to stored data; and
a fixed resistance element provided on a side surface of the variable resistance element, and comprising a conductive film, the fixed resistance element being connected in parallel with the variable resistance element,
wherein resistance of the fixed resistance element is smaller than resistance of the variable resistance element in the high-resistance state and larger than resistance of the variable resistance element in the low-resistance state.

9. The memory of claim 8, wherein resistance Rp of the fixed resistance element satisfies a relation of Rp<Vset/Icomp if Vset is a set voltage that changes the state of the variable resistance element from the high-resistance state to the low-resistance state, and Icomp is an upper limit of a current that is supplied with the variable resistance element when the state of the variable resistance element changes from the high-resistance state to the low-resistance state.

10. The memory of claim 9, wherein the upper limit Icomp is smaller than a current that dielectrically breaks down the resistance-change film and larger than a set current that changes the state of the variable resistance element from the high-resistance state to the low-resistance state.

11. The memory of claim 8, further comprising:
a first line connected to a first terminal of the variable resistance element;
a selection element comprising a first terminal connected to a second terminal of the variable resistance element; and
a second line connected to a second terminal of the selection element.

12. The memory of claim 11, wherein the selection element is a diode.

13. The memory of claim 11, wherein memory cells each comprise the variable resistance element, the fixed resistance element and selection element, and the memory cells are arranged in intersection areas between first lines and second lines.

14. The memory of claim 8, wherein the conductive film is formed to cover the periphery of the variable resistance element.

* * * * *